(12) United States Patent
Kim et al.

(10) Patent No.: US 12,471,469 B2
(45) Date of Patent: Nov. 11, 2025

(54) DISPLAY PANEL AND DISPLAY DEVICE INCLUDING THE SAME

(71) Applicant: LG Display Co., Ltd., Seoul (KR)

(72) Inventors: Won Doo Kim, Paju-si (KR); Jae Hyung Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/970,509

(22) Filed: Dec. 5, 2024

(65) Prior Publication Data
US 2025/0268035 A1 Aug. 21, 2025

(30) Foreign Application Priority Data
Feb. 21, 2024 (KR) ........................ 10-2024-0024857

(51) Int. Cl.
*G09G 3/32* (2016.01)
*G09G 3/3233* (2016.01)
(Continued)

(52) U.S. Cl.
CPC ......... *H10K 59/131* (2023.02); *G09G 3/3233* (2013.01); *G09G 2300/0426* (2013.01); *G09G 2300/0452* (2013.01); *G09G 2300/0465* (2013.01); *G09G 2300/0842* (2013.01); *G09G 2310/08* (2013.01); *G09G 2320/0233* (2013.01); *G09G 2320/041* (2013.01); *G09G 2330/021* (2013.01); *H10K 59/351* (2023.02)

(58) Field of Classification Search
CPC .. H10K 59/131; H10K 59/351; G09G 3/3233; G09G 2300/0426; G09G 2300/0452; G09G 2300/0465; G09G 2300/0842; G09G 2310/08; G09G 2320/0233; G09G 2320/041; G09G 2330/021
See application file for complete search history.

(56) References Cited

U.S. PATENT DOCUMENTS 6,771,028 B1 8/2004 Winters
2010/0039030 A1 2/2010 Winters
(Continued)

FOREIGN PATENT DOCUMENTS

KR 10-2004-0094353 A 11/2004
KR 10-1576221 B1 12/2015
(Continued)

*Primary Examiner* — Pegeman Karimi
(74) *Attorney, Agent, or Firm* — Morgan, Lewis & Bockius LLP

(57) ABSTRACT

A display panel may include a plurality of sub-pixels arranged in pixel lines and pixel columns. The pixel lines may extend along a first direction. The pixel columns may extend along a second direction orthogonal to the first direction. Each pixel may include first, second, third and fourth sub-pixels adjacent to each other and configured to emit light having different colors. Each sub-pixel may include a pixel circuit and an emission region connected to the pixel circuit. When viewed in the second direction, the pixel circuit of each sub-pixel of a pixel column is disposed below the corresponding emission region, and the pixel circuit of each sub-pixel of an adjacent pixel column is disposed above the corresponding emission region. A display device including a display panel is also disclosed.

27 Claims, 5 Drawing Sheets

(51) Int. Cl.
   *H10K 59/131* (2023.01)
   *H10K 59/35* (2023.01)

(56) References Cited

U.S. PATENT DOCUMENTS

| | | | |
|---|---|---|---|
| 2016/0071910 A1* | 3/2016 | Sasaki | H10K 59/351 |
| | | | 257/89 |
| 2016/0104750 A1* | 4/2016 | Jinta | H10K 59/351 |
| | | | 257/40 |
| 2019/0355802 A1* | 11/2019 | Shim | H10K 59/131 |
| 2020/0203449 A1* | 6/2020 | Jeon | H10K 59/121 |
| 2022/0093679 A1* | 3/2022 | Jo | H10D 86/441 |
| 2023/0217749 A1 | 7/2023 | Kim | |

FOREIGN PATENT DOCUMENTS

| KR | 10-2016-0030444 A | 3/2016 |
|---|---|---|
| KR | 10-2023-0103729 A | 7/2023 |

* cited by examiner

DISPLAY PANEL AND DISPLAY DEVICE INCLUDING THE SAME

CROSS-REFERENCE TO RELATED APPLICATIONS

This application claims the benefit of and priority to Korean Patent Application No. 10-2024-0024857, filed Feb. 21, 2024, the entire contents of which are incorporated herein by reference for all purposes.

BACKGROUND

1. Technical Field

The present disclosure relates to a display panel and a display device including the same.

2. Discussion of the Related Art

An organic light-emitting display device may include an organic light-emitting diode (hereinafter, referred to as "OLED") that emits light by itself, and has advantages of fast response speed and high luminous efficiency, luminance, and viewing angle. An organic light-emitting display device has an excellent contrast ratio and color reproduction rate because it has a fast response speed and excellent luminous efficiency, luminance, viewing angle, and the like, and may express black grayscale in complete black.

Various studies are being conducted to secure the aperture ratio of the organic light-emitting display device, but it is difficult to design an aperture ratio improvement because there are many wires required for driving pixels. Moreover, when each of the pixels is composed of four colors including red, green, blue, and white, it is more difficult to secure an aperture ratio.

In order to reduce the number of data lines, data voltages of two colors may be supplied to one data line, and the data voltages of two colors may be supplied to sub-pixels of two colors connected to that data line in a time-division method. However, in this method, since the toggling of the data voltage applied through the data line increases, a heat generation problem of an integrated circuit (IC) in which a data driving circuit is integrated may occur, and dimness in the form of a horizontal line may be visually recognized on the screen of a display panel.

The description of the related art should not be assumed to be prior art merely because it is mentioned in or associated with this section. The description of the related art includes information that describes one or more aspects of the subject technology, and the description in this section does not limit the invention.

SUMMARY

The inventors of the present disclosure have recognized the problems and needs of the related art, have performed extensive research and experiments, and have developed a new invention. One or more aspects of the present disclosure are directed to a display panel and a display device that address the limitations, needs and/or disadvantages of the related art.

In one or more aspects, the present disclosure provides a display panel capable of improving an aperture ratio and overcoming an IC heating problem and a line dim problem observed on a screen, and a display device including the same.

The aspects of the present disclosure are not limited to the above-mentioned aspects, and other aspects not mentioned will be clearly understood by those skilled in the art from the present disclosure.

A display panel according to one or more example embodiments of the present disclosure includes a plurality of pixels having a plurality of sub-pixels. The plurality of sub-pixels may be arranged in pixel lines and pixel columns. The pixel columns may include a first pixel column, a second pixel column, a third pixel column, and a fourth pixel column that are arranged sequentially. The pixel lines may extend along a first direction. The pixel columns may extend along a second direction orthogonal to the first direction. Each of the plurality of pixels may include a first sub-pixel, a second sub-pixel, a third sub-pixel, and a fourth sub-pixel adjacent to each other and configured to emit light having different colors. The plurality of sub-pixels may include the first sub-pixels, the second sub-pixels, the third sub-pixels, and the fourth sub-pixels. Each sub-pixel of the plurality of sub-pixels may include a pixel circuit and an emission region connected to the pixel circuit.

When viewed in the second direction, the pixel circuit of each of sub-pixels arranged in the second pixel column and the third pixel column may be disposed below the corresponding emission region, and the pixel circuit of each of sub-pixels arranged in the first pixel column and the fourth pixel column may be disposed above the corresponding emission region, or when viewed in the second direction, the pixel circuit of each of the sub-pixels arranged in the second pixel column and the third pixel column may be disposed above the corresponding emission region, and the pixel circuit of each of the sub-pixels arranged in the first pixel column and the fourth pixel column may be disposed below the corresponding emission region.

The display panel may further include: a plurality of gate lines disposed parallel to the first direction; and a first data line pair, a second data line pair, and a third data line pair disposed parallel to the second direction. The first data line pair may include: a first data line connected to the first sub-pixels that are in the first pixel column; and a third data line arranged adjacent to the first data line and connected to the third sub-pixels that are in the first pixel column. The second data line pair may include: a second data line connected to the second sub-pixels that are in the second pixel column and the third pixel column; and a fourth data line arranged adjacent to the second data line and connected to the fourth sub-pixels that are in the second pixel column and the third pixel column. The third data line pair may include: a fifth data line connected to the first sub-pixels that are in the fourth pixel column; and a sixth data line arranged adjacent to the fifth data line and connected to the third sub-pixels that are in the fourth pixel column. The second data line pair may be spaced apart from each of the first data line pair and the third data line pair by a length of one pixel in the first direction, between the first data line pair and the third data line pair.

The display panel may further include: a first power line group parallel to the second direction and disposed between the first data line pair and the second data line pair; and a second power line group parallel to the second direction and disposed between the second data line pair and the third data line pair.

Each of the first power line group and the second power line group may include: a first power line to which a first constant voltage is for being supplied to the pixel circuit of each of the first sub-pixels that are adjacent to the first power line, the pixel circuit of each of the second sub-pixels that are adjacent to the first power line, the pixel circuit of each of the third sub-pixels that are adjacent to the first power line, and the pixel circuit of each of the fourth sub-pixels that are adjacent to the first power line; and a second power line to which a second constant voltage is for being supplied to the pixel circuit of each of the first sub-pixels that are adjacent to the second power line, the pixel circuit of each of the second sub-pixels that are adjacent to the second power line, the pixel circuit of each of the third sub-pixels that are adjacent to the second power line, and the pixel circuit of each of the fourth sub-pixels that are adjacent to the second power line.

Each of the pixel circuits of the plurality of sub-pixels may include: a driving transistor including a gate electrode connected to a first node, a first electrode connected to a second node, and a second electrode connected to a third node; a light-emitting element including an anode electrode connected to the third node, and a cathode electrode to which a cathode voltage is for being applied; a first switch transistor connected between a data line and the first node and configured to be turned on in response to a gate pulse being applied to a gate line; a second switch transistor connected between the third node and the corresponding first power line and configured to be turned on in response to the gate pulse; and a capacitor connected between the first node and the third node. The corresponding second power line may be connected to the second node.

For each of the first and second power line groups: the first power line may include third and fourth power lines; each of the third and fourth power lines may be disposed adjacently on a corresponding side of the second power line; and a width of the second power line may be greater than a width of each of the third and fourth power lines.

The pixel lines may include a first pixel line and a second pixel line.

The plurality of pixels may have a first pixel including: the first sub-pixel disposed at an intersection of the first pixel line and the first pixel column; the second sub-pixel disposed at an intersection of the first pixel line and the second pixel column; the third sub-pixel disposed at an intersection of the second pixel line and the first pixel column; and the fourth sub-pixel disposed at an intersection of the second pixel line and the second pixel column.

The plurality of pixels may have a second pixel including: the first sub-pixel disposed at an intersection of the second pixel line and the fourth pixel column; the second sub-pixel disposed at an intersection of the second pixel line and the third pixel column; the third sub-pixel disposed at an intersection of the first pixel line and the fourth pixel column; and the fourth sub-pixel disposed at an intersection of the first pixel line and the third pixel column.

For each of the plurality of pixels, the first sub-pixel may be a white sub-pixel, the second sub-pixel may be a red sub-pixel, the third sub-pixel may be a green sub-pixel, and the fourth sub-pixel may be a blue sub-pixel.

Alternatively, for each of the plurality of pixels, the first sub-pixel, the second sub-pixel, the third sub-pixel, and the fourth sub-pixel may be selected from a group consisting of a white sub-pixel, a red sub-pixel, a green sub-pixel and a blue sub-pixel.

The plurality of pixels may include a first pixel and a second pixel. The first pixel and the second pixel may be disposed in a left-right symmetrical structure with respect to the second direction. The plurality of pixels in a display area of the display panel may be disposed in such a way that a structure of the first and second pixels is repeated.

A display device according to one or more example embodiments of the present disclosure includes: the display panel as described above; a data driving circuit configured to output data voltages to data lines of the plurality of data line pairs; and a gate driving circuit configured to output gate pulses to the plurality of gate lines.

A data voltage of a same color may be applied to a corresponding data line.

The display device may be configured to display a pure color or a white color on the display panel without toggling any of the data lines.

In one or more examples, sub-pixels, among the plurality of sub-pixels, configured to emit light having a same color are disposed not consecutively along the first direction and not consecutively along the second direction.

For each of the plurality of pixels, the emission regions may have sizes that are different from one another.

According to one or more aspects of the present disclosure, high efficiency and high luminance pixel driving is possible by using 4 sub-pixel driving, so that the display panel may be driven at low power.

According to one or more aspects of the present disclosure, the aperture ratio of subpixels can be increased by arranging data lines adjacent to each other and power lines adjacent to each other.

According to one or more aspects of the present disclosure, when a pure color or a white color is displayed on the display panel, there is almost no toggle in the data voltage applied to the data lines. Therefore, current consumption and heat generation can be minimized in the IC with integrated data driving circuit, and line dimming can be minimized.

The effects of the present disclosure are not limited to those mentioned above, and other effects not mentioned will be clearly understood by those skilled in the art from the present disclosure.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the drawings. It is intended that all such features, advantages, and aspects be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles and examples of the disclosure. In the drawings.

Figure 1:
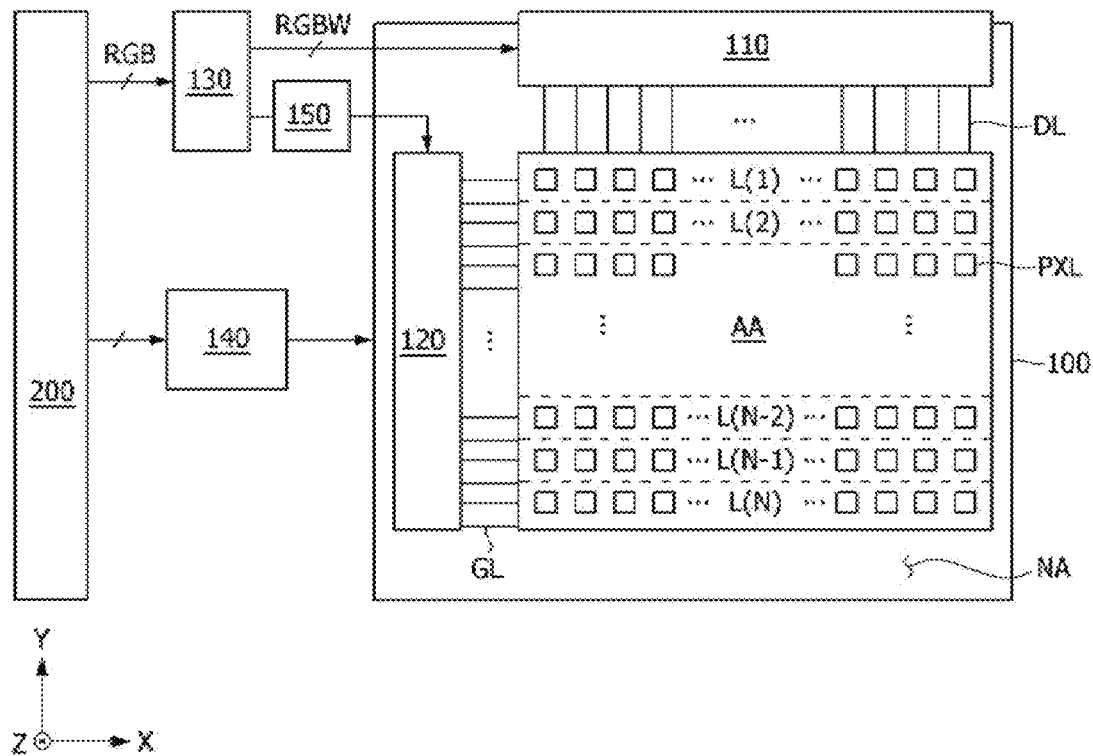
FIG. 1 is a block diagram illustrating a display device according to one example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term "comprise," "have," "include," "contain," "constitute," "made of," "formed of," "composed of," or the like is used with respect to one or more elements (e.g., layers, components, pixels, sub-pixels, pixel lines, pixel columns, pixel circuits, emission regions, data lines, power lines, regions, areas, portions, steps, operations, and/or the like), one or more other elements may be added unless a term such as "only" or the like is used. The terms used in the present disclosure are merely used in order to describe particular example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. In one or more implementations, "embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

When a positional relationship between two elements (e.g., layers, components, pixels, sub-pixels, pixel lines, pixel columns, pixel circuits, emission regions, data lines, power lines, regions, areas, portions, and/or the like) are described using any of the terms such as "on," "on a top of," "upon," "on top of," "over," "under," "above," "upper," "below," "lower," "beneath," "near," "close to," "adjacent to," "beside," "next to," "at or on a side of," and/or the like indicating a position or location, one or more other elements may be located between the two elements unless a more limiting term, such as "immediate(ly)," "direct(ly)," or "close(ly)," is used. For example, when an element and another element are described using any of the foregoing terms, this description should be construed as including a case in which the elements contact each other directly as well as a case in which one or more additional elements are disposed or interposed therebetween. Furthermore, the spatially relative terms such as the foregoing terms as well as other terms such as "front," "rear," "back," "left," "right," "top," "bottom," "upper," "lower," "downward," "upward," "up," "down," "column," "row," "vertical," "horizontal," "diagonal," and the like refer to an arbitrary frame of reference. For example, these terms may be used for an example understanding of a relative relationship between elements, including any correlation as shown in the drawings. However, embodiments of the disclosure are not limited thereby or thereto. The spatially relative terms are to be understood as terms including different orientations of the elements in use or in operation in addition to the orientation depicted in the drawings or described herein. For example, where a lower element or an element positioned under another element is overturned, then the element may be termed as an upper element or an element positioned above another element. Thus, for example, the term "under" or "beneath" may encompass, in meaning, the term "above" or "over." An example term "below" or the like, can include all directions, including directions of "below," "above" and diagonal directions. Likewise, an example term "above," "on" or the like can include all directions, including directions of "above," "on," "below" and diagonal directions.

In describing a temporal relationship, when the temporal order is described as, for example, "after," "following," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

It is understood that, although the terms "first," "second," and the like may be used herein to describe various elements (e.g., layers, components, pixels, sub-pixels, pixel lines, pixel columns, pixel circuits, emission regions, data lines, power lines, regions, areas, portions, steps, operations, and/or the like), these elements should not be limited by these terms, for example, to any particular order, precedence, or number of elements. These terms are used only to distinguish one element from another. For example, a first element may denote a second element, and, similarly, a second element may denote a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element (e.g., layer, film, component, pixel, sub-pixel, pixel line, pixel column, pixel circuit, emission region, data line, power line, region, area, portion, or the like) is "crossing," "intersecting," "connected," "coupled," "attached," "adhered," "linked," or the like another element or to another element, the element can not only be directly crossing, intersecting, connected, coupled, attached, adhered, linked, or the like another element or to another element, but also be indirectly crossing, intersecting, connected, coupled, attached, adhered, linked, or the like another element or to another element with one or more intervening elements disposed or interposed between the elements, unless otherwise specified.

For the expression that an element (e.g., layer, film, component, pixel, sub-pixel, pixel line, pixel column, pixel circuit, emission region, data line, power line, region, area, portion, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The phrase that an element (e.g., layer, film, component, pixel, sub-pixel, pixel line, pixel column, pixel circuit, emission region, data line, power line, region, area, portion, or the like) is "provided," "disposed," "connected," "coupled," or the like in, on, with or to another element may be understood, for example, as that at least a portion of the element is provided, disposed, connected, coupled, or the like in, on, with or to at least a portion of another element. The phrase "through" may be understood, for example, to be at least partially through or entirely through. The phrase that an element (e.g., layer, film, component, pixel, sub-pixel, pixel line, pixel column, pixel circuit, emission region, data line, power line, region, area, portion, or the like) "contacts," "overlaps," or the like with another element may be understood, for example, as that at least a portion of the element contacts, overlaps, or the like with a least a portion of another element.

The terms such as a "line" or "direction" should not be interpreted only based on a geometrical relationship in which the respective lines or directions are parallel, perpendicular, diagonal, or slanted with respect to each other, and may be meant as lines or directions having wider directivities within the range within which the components of the present disclosure may operate functionally. For example, the terms "first direction," "second direction," and the like should not be interpreted only based on a geometrical relationship in which the respective directions are parallel, perpendicular, diagonal, or slanted with respect to each other, and may be meant as directions having wider directivities within the range within which the components of the present disclosure may operate functionally.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, at least one of a plurality of elements can represent (i) one element of the plurality of elements, (ii) some elements of the plurality of elements, or (iii) all elements of the plurality of elements.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, component, pixel, sub-pixel, pixel line, pixel column, pixel circuit, emission region, data line, power line, region, area, portion, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise. In one or more aspects, unless stated otherwise, the term "$n^{th}$" may refer to "$n^{nd}$" (e.g., $2^{nd}$ where n is 2), or "n &" (e.g., $3^{rd}$ where n is 3), and n may be a natural number.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure may be partially or entirely coupled to or combined with each other, may be technically associated with each other, and may be variously operated, linked or driven together in various ways. Embodiments of the present disclosure may be implemented or carried out independently of each other or may be implemented or carried out together in a co-dependent or related relationship. In one or more aspects, the components of each apparatus and device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in more detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

A pixel circuit and a gate drive circuit of the display device may include a plurality of transistors. The transistor may be implemented as a thin film transistor (TFT). The transistors may be implemented as an oxide thin film transistor (TFT) including an oxide semiconductor, a low temperature poly silicon TFT (LTPS TFT) including a low temperature poly silicon, and the like.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS)), since carriers are holes, a source voltage is higher than a drain voltage such that holes may flow from a source to a drain. In the p-channel transistor, since holes flow from the source to the drain, current flows from the source to the drain. It should be noted that a source and a drain of a transistor are not fixed. For example, a source and a drain may be changed according to an applied voltage. Therefore, the disclosure is not limited to a source and a drain of a transistor. In the following description, a source and a drain of a transistor may be referred to as a first electrode and a second electrode or as a second electrode and a first electrode.

A gate signal swings between a gate-on voltage and a gate-off voltage. A transistor is turned on in response to a gate-on voltage and is turned off in response to a gate-off voltage. In the case of an n-channel transistor, the gate-on voltage may be a gate high voltage VGH, and the gate-off voltage may be a gate low voltage VGL. In the case of a p-channel transistor, the gate-on voltage may be the gate low voltage VGL, and the gate-off voltage may be the gate high voltage VGH.

Hereinafter, various embodiments of the present disclosure will be described in detail with reference to the accompanying drawings.

FIG. 1 is a block diagram illustrating a display device according to one example embodiment of the present disclosure.

Referring to FIG. 1, a display device according to an example embodiment of the present disclosure includes a display panel 100, a display panel driving circuit for writing pixel data to pixels of the display panel 100, and a power supply 140 that generates power necessary for driving the pixels and the display panel driving circuit.

The display panel 100 may be a panel having a rectangular structure having a length in an X-axis direction (or a first direction), a width in a Y-axis direction (or a second direction), and a thickness in a Z-axis direction (or a third direction). The X-axis and the Y-axis may be linear axes orthogonal to each other on the XY plane. The display area AA of the display panel 100 includes a pixel array displaying an input image. The pixel array includes a plurality of data lines DL, a plurality of gate lines GL intersecting the data lines DL, and pixels arranged in a matrix form. The display panel 100 includes power lines commonly connected to the pixels. The power lines are connected to constant voltage nodes of the pixel circuits so as to supply a constant voltage required for driving the pixels PXL to the pixels PXL. The power lines may be implemented as stripe or mesh wires to be commonly connected to pixels of the display panel 100.

Figure 2:
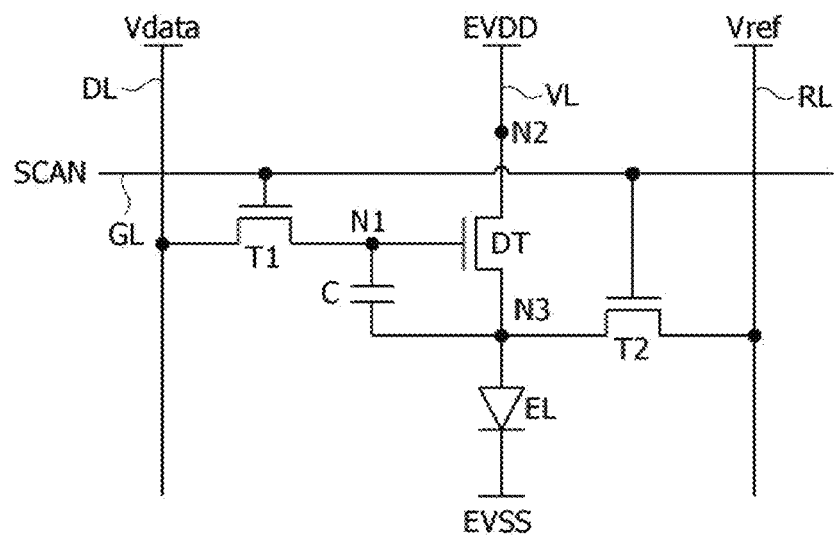
FIG. 2 is a circuit diagram illustrating a pixel circuit according to one example embodiment of the present disclosure.

Each of the pixels PXL includes a first sub-pixel, a second sub-pixel, a third sub-pixel, and a fourth sub-pixel of different colors for color implementation. In this example, the first sub-pixel, the second sub-pixel, the third sub-pixel, and the fourth sub-pixel are configured to emit light having different colors. The color arrangement of the sub-pixels may be varied. In the following example embodiment, the first sub-pixel may be a white (W) sub-pixel, the second sub-pixel may be a red (R) sub-pixel, the third sub-pixel may be a green (G) sub-pixel, and the fourth sub-pixel may be a blue (B) sub-pixel, but the present disclosure is not limited thereto. Each of the sub-pixels includes a pixel circuit for driving a light-emitting element. Each of the pixel circuits may be connected to the data line, the gate line, and the power line, as shown in FIG. 2. Each of the sub-pixels may be divided into a circuit region and an emission region. The pixel circuit is disposed in the circuit region. The emission region is an area where light of the light-emitting element electrically connected to the pixel circuit is emitted.

The pixel array includes a plurality of pixel lines L(1) to L(N). Each of the pixel lines L(1) to L(N) includes one line of pixels arranged along a gate line direction (the X-axis direction) in the pixel array of the display panel 100. The pixels arranged in the one pixel line share the gate line GL. The sub-pixels arranged in a column direction (the Y-axis direction) along a data line direction share the same data line DL. One horizontal period is a time obtained by dividing one frame period by the total number of the pixel lines L(1) to L(N).

The power supply 140 uses a DC-DC converter to output a voltage required to drive the pixels of the display panel 100 and the display panel driving circuit. The DC-DC converter may include a charge pump, a regulator, a buck converter, a boost converter, and the like.

The display panel driving circuit writes the pixel data of the input image to the pixels of the display panel 100 under the control of a timing controller 130. The display panel driving circuit includes a data driver 110 and a gate driver 120.

The display panel driving circuit may drive the pixels by a double rate driving (DRD) method. In the display panel driven by the DRD, the data lines DL are connected to adjacent sub-pixels on the left and right sides, reducing the number of channels of the data driver 110 and the number of data lines DL, which is advantageous for securing an aperture rate of the pixels.

The display panel driving circuit may further include a touch sensor driver for driving touch sensors. The touch sensor driver is omitted in FIG. 1. The data driver 110 and the touch sensor driver may be integrated together in a single source drive integrated circuit (IC).

The data driver 110 receives the pixel data of the input image transmitted as a digital signal from the timing controller 130 and outputs a data voltage. The data driver 110 converts the pixel data of the input image into a gamma compensation voltage every frame period using a digital to analog converter (DAC) and outputs the data voltage. The data voltage is outputted from each of the channels of the data driver 110 through an output buffer.

The gate driver 120 may be formed in the display panel 100 together with wires and a TFT array of the pixel array. The gate driver 120 may be disposed in a non-display area NA of the display panel 100, or may be disposed at least partially in a display area AA where the input image is reproduced.

The gate driver 120 may be disposed in the non-display area NA on both sides of the display panel 100, with the display area AA of the display panel 100 interposed therebetween, to supply pulses of the gate signals (hereinafter referred to as a "gate pulses") to both sides of the gate lines GL in a double feeding manner. In another example embodiment, the gate driver 120 may be disposed in any one of the left or right non-display area NA of the display panel 100 to supply the gate signals to the gate lines GL in a single feeding manner. The gate driver 120 sequentially outputs the gate pulses to the gate lines under the control of the timing controller 130. The gate driver 120 may shift the gate pulses using a shift register to sequentially supply the signals to the gate lines GL. The gate driver 120 may include the shift register for outputting the gate pulses.

The timing controller 130 receives digital video data of the input image and a timing signal synchronized with this data from a host system 200. The timing signal may include a vertical synchronization signal, a horizontal synchronization signal, a clock signal, and a data enable signal, and the like. The vertical synchronization signal and the horizontal synchronization signal may be omitted since a vertical period and a horizontal period may be known by counting the data enable signal. The data enable signal has a cycle of one horizontal period 1H. Based on the timing signal received from the host system 200, the timing controller 130 generates a data timing control signal for controlling an operation timing of the data driver 110 and a gate timing control signal for controlling an operation timing of the gate driver 120.

The timing controller 130 may convert pixel data RGB of three primary colors inputted from the host system into four-sub-color data RGBW by adding white data, and may transmit the four-sub-color data to the data driver 110. The method of converting the three primary color pixel data RGB to the four-sub-color data RGBW including white data may use any known color conversion algorithm. For example, the timing controller 130 may generate white data (hereinafter referred to as "W data") of the pixel data based on a minimum grayscale value among red data (hereinafter referred to as "R data"), green data (hereinafter referred to as "G data"), and blue data (hereinafter referred to as "B data") of the pixel data received as data of the input image, and may convert each pixel data into the four-sub-color data RGBW. In each pixel data, the grayscale values of the R, G, and B data may be lowered by the W data that provides additional luminance. Here, the R data is data to be written to the red sub-pixel, and the G data is data to be written to the green sub-pixel. The B data is data to be written to the blue sub-pixel, and the W data is data to be written to the white sub-pixel.

A level shifter 150 may receive the gate timing control signal from the timing controller 130 to generate a start pulse and a shift clock, and provide them to the gate driver 120. The start pulse and shift clock outputted from the level shifter 150 swing between the gate high voltage and the gate low voltage.

The host system 200 may scale an image signal from a video source to match the resolution of the display panel 100 and transmit it to the timing controller 130 together with the timing signal.

FIG. 2 is a circuit diagram illustrating a pixel circuit according to one example embodiment of the present disclosure.

Referring to FIG. 2, the pixel circuit is connected to the data line DL to which a data voltage Vdata of the pixel data is applied, the gate line GL to which a gate pulse SCAN is applied, a power line VL to which a pixel driving voltage EVDD is applied, a power line to which a cathode voltage EVSS is applied, and an REF line RL to which a reference voltage Vref is applied.

A light-emitting element EL may be an organic light emitting diode (OLED) or an inorganic light-emitting element such as a micro LED. The light-emitting element EL may be any one of a red light-emitting element, a green light-emitting element, and a blue light-emitting element. The anode electrode of the light-emitting element EL may be electrically connected to a driving element DT and disposed in the emission region of the sub-pixel. The light-emitting element EL emits light when a current is generated from the driving element DT, and the light is emitted to the outside of the display panel 100 through the emission region.

The pixel circuit may include the light-emitting element EL, the driving element DT, a first switch element T1, a second switch element T2, and a capacitor C. The driving element DT and the switch elements T1 and T2 may be implemented as n-channel oxide TFTs, but are not limited thereto.

The driving element DT generates a current based on its gate-source voltage to drive the light-emitting element EL. The driving element DT includes a gate electrode connected to a first node N1, a first electrode connected to a second node N2, and a second electrode connected to a third node N3. The capacitor C is connected between the first node N1 and the third node N3. The second node N2 is connected to the EVDD power line VL. The third node N3 is connected to the anode electrode of the light-emitting element EL. The cathode electrode of the light-emitting element EL is connected to the power line to which the cathode voltage EVSS is applied.

The first switch element T1 is connected between the data line DL and the first node N1. The first switch element T1 is turned on in response to the gate pulse SCAN. When the first switch element T1 is turned on, the first node N1 is electrically connected to the data line DL. The first switch element T1 includes a gate electrode connected to the gate line GL, a first electrode connected to the data line DL, and a second electrode connected to the first node N1. A data voltage of the same color is applied to the corresponding data line DL.

The second switch element T2 is connected between the third node N3 and the REF line RL. The second switch element T2 is turned on in response to the gate pulse SCAN. When the second switch element T2 is turned on, the third node N3 is electrically connected to the REF line RL. The second switch element T2 includes a gate electrode connected to the gate line GL, a first electrode connected to the third node N3, and a second electrode connected to the REF line RL.

The driving element DT should have uniform electrical characteristics in all sub-pixels, but due to process deviations and element characteristic deviations, there may be differences between sub-pixels, and the differences may increase as the driving time of the sub-pixels elapses. To compensate for such deviations in the electrical characteristics of the driving element DT, an external compensation circuit may be applied to the display panel driving circuit. The external compensation circuit may be electrically connected to the driving element DT of each of the sub-pixels.

The external compensation circuit compensates for the electrical characteristics of the driving element DT by sensing the electrical characteristics in real time in a sensing mode. The sensing mode is divided into pre-shipment and post-shipment sensing modes. Prior to shipment, the electrical characteristics of the driving element DT are sensed at each sub-pixel through the REF line RL connected to the pixels, and based on the sensing result, the deviation in the electrical characteristics of the driving element DT is compensated for each sub-pixel.

The post-shipment sensing mode may be divided into an ON RF mode, which is performed in a power on sequence, an RT mode, which is performed in a vertical blank period (VB) during a display driving period, and an OFF RS mode, which is performed in a power off sequence.

In the ON RF mode, the external compensation circuit senses a mobility of the driving element DT that drives the light-emitting element through the REF line RL in each of the pixels when the display device is powered on, compares the mobility sensing result with a mobility compensation value of the driving element measured for each sub-pixel prior to shipment, and updates the mobility compensation value based on the difference. In the pre-shipment sensing mode, the threshold voltage and mobility of the driving element DT for each sub-pixel are sensed, and a threshold voltage compensation value and the mobility compensation value of the driving element are set in a look-up table. The mobility of the driving element is compensated with the mobility compensation value reflecting the mobility sensing result of the driving element for each sub-pixel.

In the RT mode, the mobility of the driving element DT is sensed in real time through the REF line RL in the vertical blank period (VB) every frame period during the display driving period in which an image is displayed, and the mobility compensation value is updated for each sub-pixel based on the mobility sensing result. The vertical blank period is a period during which no data is inputted to the timing controller 130 between an active interval of an $(N-1)^{th}$ frame period and an active interval of an $N^{th}$ frame period.

In the OFF RS mode, when the display panel is powered off, the external compensation circuit senses the threshold voltage of the driving element DT through the REF line RL at each pixel, and updates the threshold voltage compensation value for each sub-pixel based on the threshold voltage sensing result. In the OFF RS mode, the display panel driving circuit and the external compensation circuit are driven for a preset delay time before the power is completely turned off to sense the threshold voltage of the driving element DT at each sub-pixel and update the threshold voltage compensation value of the driving element DT for each sub-pixel.

The external compensation circuit includes an analog to digital converter (hereinafter referred to as "ADC") electrically connected to the REF line RL, and a compensation circuit that receives data output from the ADC. The look-up table of the compensation circuit stores compensation values for compensating the threshold voltage and mobility of the driving element which drives the light-emitting element for each sub-pixel. The compensation circuit inputs sensing data outputted from the ADC into the look-up table, and adds or multiplies the compensation value outputted from the look-up table to the pixel data of the input image to modulate the pixel data, thereby compensating for changes in the electrical characteristics of the driving element. The ADC may be disposed for each sensing channel set in the source drive IC in which the data driver 110 is integrated. The compensation circuit may be implemented as a logic circuit in the timing controller 130.

Figure 3:
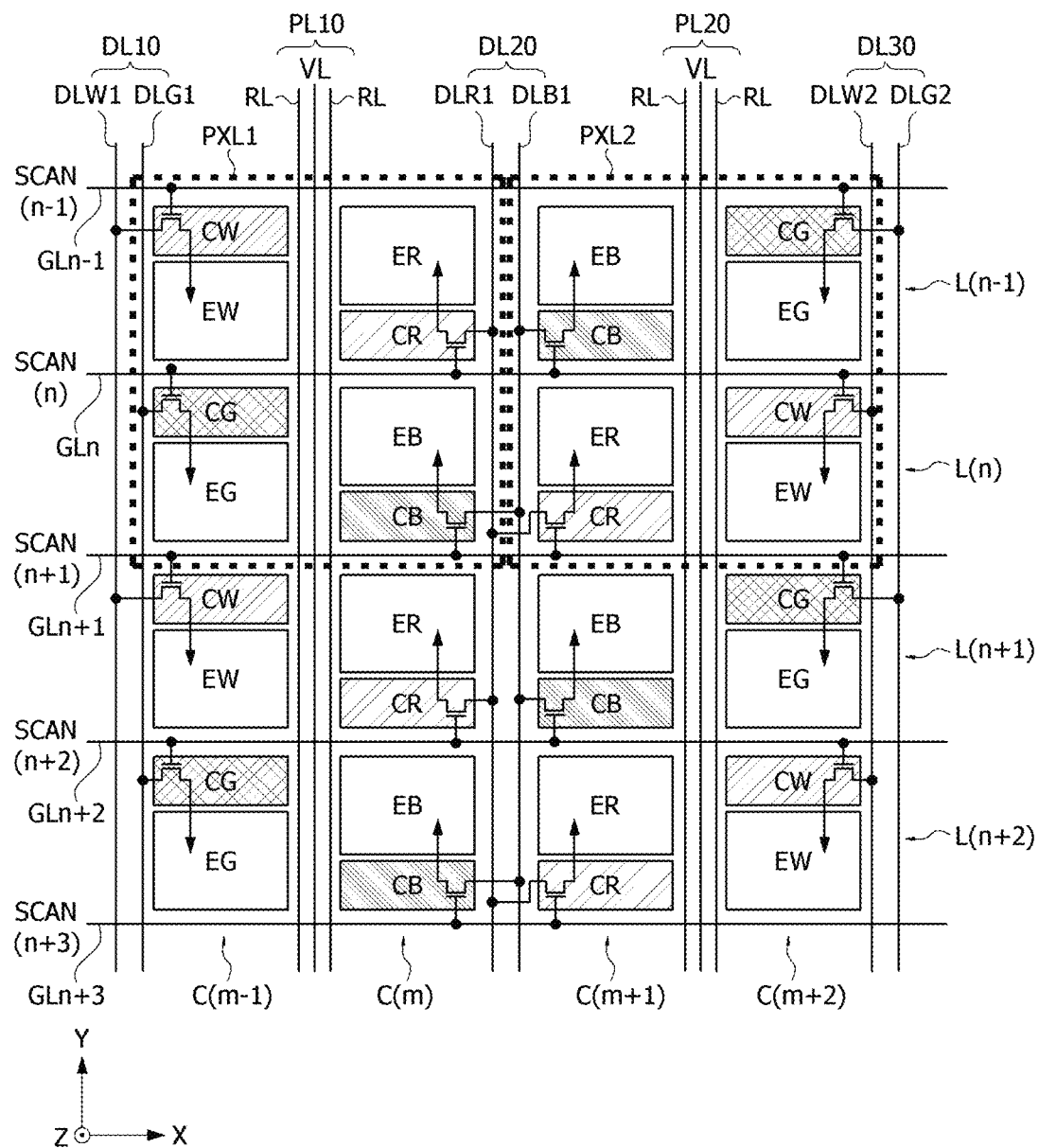
FIG. 3 is a plan view illustrating a pixel configuration according to one example embodiment of the present disclosure.

FIG. 3 is a plan view illustrating a pixel configuration according to one example embodiment of the present disclosure. In FIG. 3, "L(n−1) to L(n+2)" are $(n-1)^{th}$ to $(n+2)^{th}$ pixel lines in which the sub-pixels are arranged along the X-axis direction. "C(m−1) to C(m+2)" are $(m-1)^{th}$ to $(m+2)^{th}$ pixel columns in which the sub-pixels are arranged along the Y-axis direction. Here, "n" and "m" are each a positive integer greater than or equal to 2. A transistor shown in FIG. 3 represents the first switch element T1 shown in FIG. 2.

Referring to FIG. 3, the display panel 100 includes at least first and second pixels PXL1 and PXL2. The first and second pixels PXL1 and PXL2 may be disposed in a left-right symmetrical structure with respect to the Y-axis. The pixels may be disposed in the display area AA of the display panel 100 in such a way that the structure of the first and second pixels PXL1 and PXL2 is repeated.

The display panel 100 includes a first data line pair DL10 in which the data lines parallel to the Y-axis direction are arranged on the left side of the first pixel PXL1; a second data line pair DL20 in which the data lines parallel to the Y-axis direction are arranged at the boundary between the first pixel PXL1 and the second pixel PXL2; a third data line pair DL30 in which the data lines parallel to the Y-axis direction are arranged on the right side of the second pixel PXL2; a first power line group PL10 in which the power lines parallel to the Y-axis direction are arranged between the first data line pair DL10 and the second data line pair DL20; a second power line group PL20 in which the power lines parallel to the Y-axis direction are arranged between the second data line pair DL20 and the third data line pair DL30; and gate lines GLn−1 to GLn+3 to which gate pulses SCAN(n−1) to SCAN(n+3) are applied. The gate lines GLn−1 to GLn+3 intersect data lines DLW, DLR, DLG, and DLB, and the power lines VL and RL.

Each of the first and second pixels PXL1 and PXL2 may include the first to fourth sub-pixels of different colors. The first sub-pixel may be a white sub-pixel, and the second sub-pixel may be a red sub-pixel. The third sub-pixel may be a green sub-pixel, and the fourth sub-pixel may be a blue sub-pixel. However, the present disclosure is not limited thereto. For example, in another embodiment, the first sub-pixel, the second sub-pixel, the third sub-pixel and the fourth sub-pixel may be selected from a group consisting of a white sub-pixel, a red sub-pixel, a green sub-pixel and a blue sub-pixel.

The first sub-pixel CW, EW includes a first pixel circuit CW and a first emission region EW connected to the first pixel circuit CW to emit white light. The second sub-pixel CR, ER includes a second pixel circuit CR and a second emission region ER connected to the second pixel circuit CR to emit red light. The third sub-pixel CG, EG includes a third pixel circuit CG and a third emission region EG connected to the third pixel circuit CG to emit green light. The fourth sub-pixel CB, EB includes a fourth pixel circuit CB and a fourth emission region EB connected to the fourth pixel circuit CB to emit blue light. An anode electrode of a light-emitting element EL may be disposed in each of the emission regions EW, ER, EG, and EB. The emission regions EW, ER, EG, and EB may emit light when a current is generated from the driving elements DT of the pixel circuits CW, CR, CG, and CB.

The pixel circuits CW and CG and the emission regions EW and EG of the first and third sub-pixels CW, EW, CG, and EG are disposed in the $(m-1)^{th}$ and $(m+2)^{th}$ pixel columns C(m−1) and C(m+2). In the $(m-1)^{th}$ and $(m+2)^{th}$ pixel columns C(m−1) and C(m+2), the pixel circuits CW and CG are disposed above (as shown in FIG. 3) (or below, not shown) the emission regions EW and EG when viewed in the Y-axis direction. The pixel circuits CR and CB and the emission regions ER and EB of the second and fourth sub-pixels CR, ER, CB, and EB are disposed in the $m^{th}$ and $(m+1)^{th}$ pixel columns C(m) and C(m+1). In the m1 and $(m+1)^{th}$ pixel columns C(m) and C(m+1), the pixel circuits CR and CB are disposed below (as shown in FIG. 3) (or above, not shown) the corresponding emission regions ER and EB when viewed in the Y-axis direction. Therefore, since the pixel circuits CW, CR, CB and CG are not disposed on a straight line when viewed in the X-axis direction, the luminance degradation due to the pixel circuits CW, CR, CB and CG is not visually recognized.

The sub-pixels are arranged in the display area AA such that the sub-pixels of the same color (or the sub-pixels configured to emit light having the same color) are not consecutive in each of the X-axis and Y-axis directions. For example, the first pixel PXL1 includes the first sub-pixel CW and EW disposed at the intersection of the $(n-1)^{th}$ pixel line L(n−1) and the $(m-1)^{th}$ pixel column C(m−1), the second sub-pixel CR and ER disposed at the intersection of the $(n-1)^{th}$ pixel line L(n−1) and the $m^{th}$ pixel column C(m), the third sub-pixel CG and EG disposed at the intersection of the $n^{th}$ pixel line L(n) and the $(m-1)^{th}$ pixel column C(m−1), and the fourth sub-pixel CB and EB disposed at the intersection of the $n^{th}$ pixel line L(n) and the $m^{th}$ pixel column C(m).

The second pixel PXL2 includes the fourth sub-pixel CB and EB disposed at the intersection of the $(n-1)^{th}$ pixel line L(n−1) and the $(m+1)^{th}$ pixel column C(m+1), the third sub-pixel CG and EG disposed at the intersection of the $(n-1)^{th}$ pixel line L(n−1) and the $(m+2)^{th}$ pixel column C(m+2), the second sub-pixel CR and ER disposed at the intersection of the $n^{th}$ pixel line L(n) and the $(m+1)^{th}$ pixel column C(m+1), and the first sub-pixel CW and EW disposed at the intersection of the $n^{th}$ pixel line L(n) and the $(m+2)^{th}$ pixel column C(m+2).

The power line groups PL10 and PL20 may supply constant voltages required for driving the pixels PXL1 and PXL2 to the pixel circuits CB, CG, CR, and CW. The first power line group PL10 traverses the boundary between the first sub-pixel CW and EW and the second sub-pixel CR and ER of the first pixel PXL1, and the boundary between the third sub-pixel CG and EG and the fourth sub-pixel CB and EB of the first pixel PXL1. The second power line group PL20 traverses the boundary between the first sub-pixel CW and EW and the second sub-pixel CR and ER of the second pixel PXL2, and the boundary between the third sub-pixel CG and EG and the fourth sub-pixel CB and EB of the second pixel PXL2.

The pixel driving voltage EVDD may be applied to the EVDD power line VL and the reference voltage Vref may be applied to the REF line RL. The EVDD power line VL is connected to the adjacent pixel circuits CB, CG, CR, and CW in the X-axis direction with the EVDD power line VL interposed therebetween to supply the pixel driving voltage EVDD to these pixel circuits CB, CG, CR, and CW. The EVDD power line VL may have a relatively larger width than the REF line RL. The REF line RL may be disposed on both sides of the EVDD power line VL with the EVDD power line VL therebetween. The REF lines RL disposed on both sides of the EVDD power line VL may be connected to each other in the non-display area NA. The REF lines RL are connected to the adjacent pixel circuits CB, CG, CR, and CW in the X-axis direction to supply the reference voltage Vref to these pixel circuits CB, CG, CR, and CW.

The data voltage Vdata of the same color is applied to each corresponding one of the data lines DLW, DLG, DLR, and DLB. The first data line pair DL10 includes a first data line DLW1 to which the data voltage Vdata of the W data is applied, and a third data line DLG1 to which the data voltage Vdata of the G data is applied. The first data line DLW1 is connected to the pixel circuits CW of the first sub-pixels CW and EW adjacent to the first data line in the X-axis direction with the first data line pair DL10 between the connected first sub-pixels, and is not connected to the sub-pixels of other colors. The third data line DLG1 is connected to the pixel circuits CG of the third sub-pixels CG and EG adjacent to the third data line in the X-axis direction with the first data line pair DL10 between the connected third sub-pixels, and is not connected to the sub-pixels of other colors.

The third data line pair DL30 includes a fifth data line DLW2 to which the data voltage Vdata of the W data is applied, and a sixth data line DLG2 to which the data voltage Vdata of the G data is applied. The fifth data line DLW2 is connected to the pixel circuits CW of the first sub-pixels CW and EW adjacent to the fifth data line in the X-axis direction with the third data line pair DL30 between the connected first sub-pixels, and is not connected to the sub-pixels of other colors. The sixth data line DLG2 is connected to the pixel circuits CG of the third sub-pixels CG and EG adjacent to the sixth data line in the X-axis direction with the third data line pair DL30 between the connected third sub-pixels, and is not connected to the sub-pixels of other colors.

Since only the data voltage Vdata of the W data is applied to the first and fifth data lines DLW1 and DLW2 and only the data voltage Vdata of the G data is applied to the third and sixth data lines DLG1 and DLG2, there is no toggle of the data voltage Vdata on the data lines DLW1, DLG1, DLW2, and DLG2 when a pure color is displayed on the display panel 100.

The second data line pair DL20 may be spaced apart from each of the first data line pair DL10 and the third data line pair DL30 by an X-axis length of one pixel, between the first data line pair DL10 and the third data line pair DL30. The second data line pair DL20 includes a second data line DLR1 to which the data voltage Vdata of the R data is applied, and a fourth data line DLB1 to which the data voltage Vdata of the B data is applied. The second data line DLR1 is connected to the pixel circuits CR of the second sub-pixels CR and ER adjacent to the second data line in the X-axis direction with the second data line pair DL20 between the connected second sub-pixels, and is not connected to the sub-pixels of other colors. The fourth data line DLB1 is connected to the pixel circuits CB of the fourth sub-pixels CB and EB adjacent to the fourth data line in the X-axis direction with the second data line pair DL20 between the connected fourth sub-pixels, and is not connected to the sub-pixels of other colors. Therefore, since only the data voltage Vdata of the R data is applied to the second data line DLR1 and only the data voltage Vdata of the B data is applied to the fourth data line DLB1, there is no toggle of the data voltage Vdata on the second and fourth data lines DLR1 and DLB1 when a pure color is displayed on the display panel 100.

The display panel 100 may be implemented as a bottom emission type display panel. In this case, when the light-emitting elements of the sub-pixels emit light, the light is emitted to the outside through a transparent substrate GLS as shown in FIG. 5.

Figure 4:
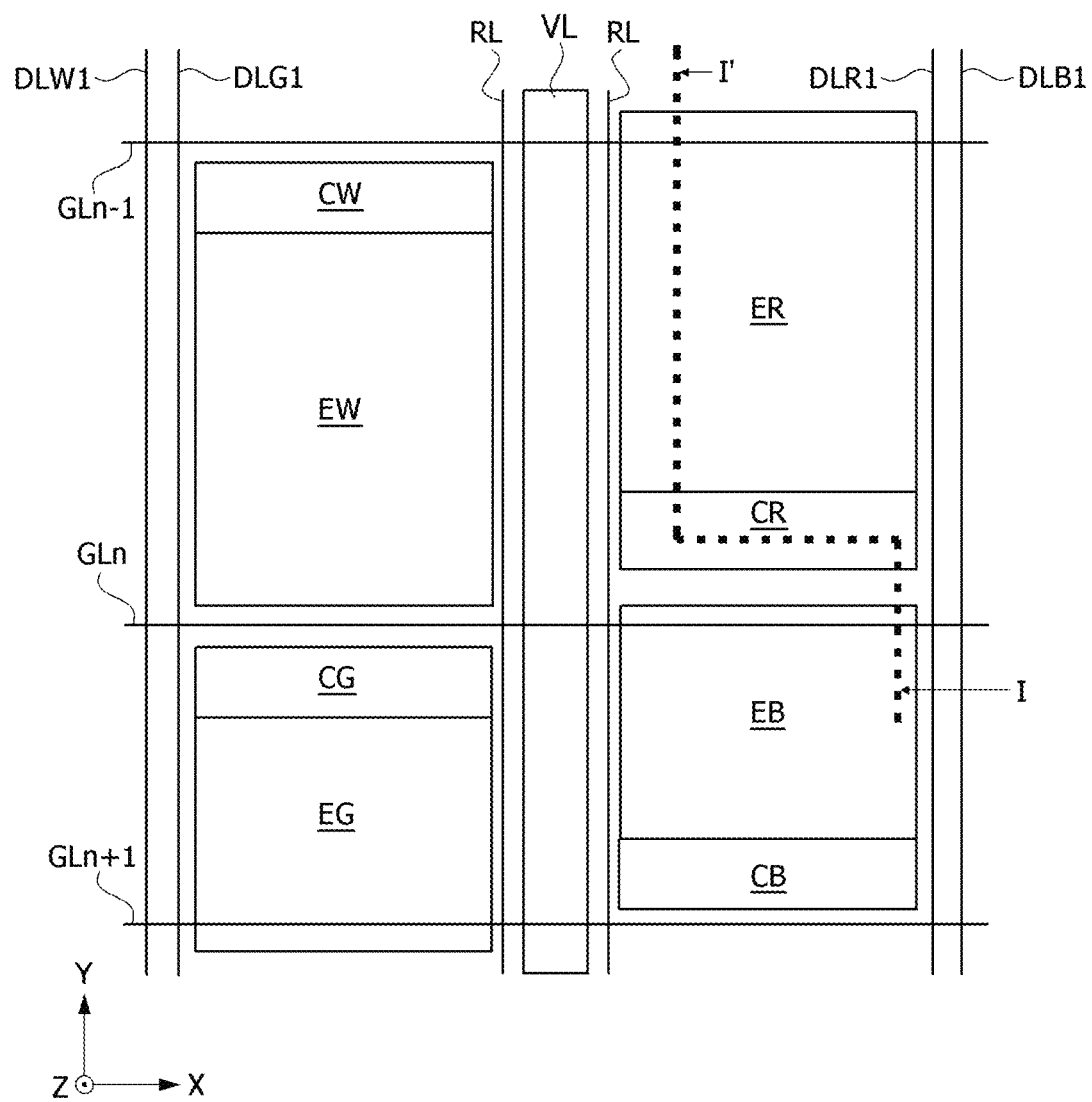
FIG. 4 is an example of a plan view illustrating the first pixel PXL1 shown in FIG. 3 in detail.

FIG. 4 is an example of a plan view illustrating the first pixel PXL1 shown in FIG. 3 in detail. FIG. 5 is an example of a cross-sectional view of a display panel taken along line I-I' of FIG. 4.

Figure 5:
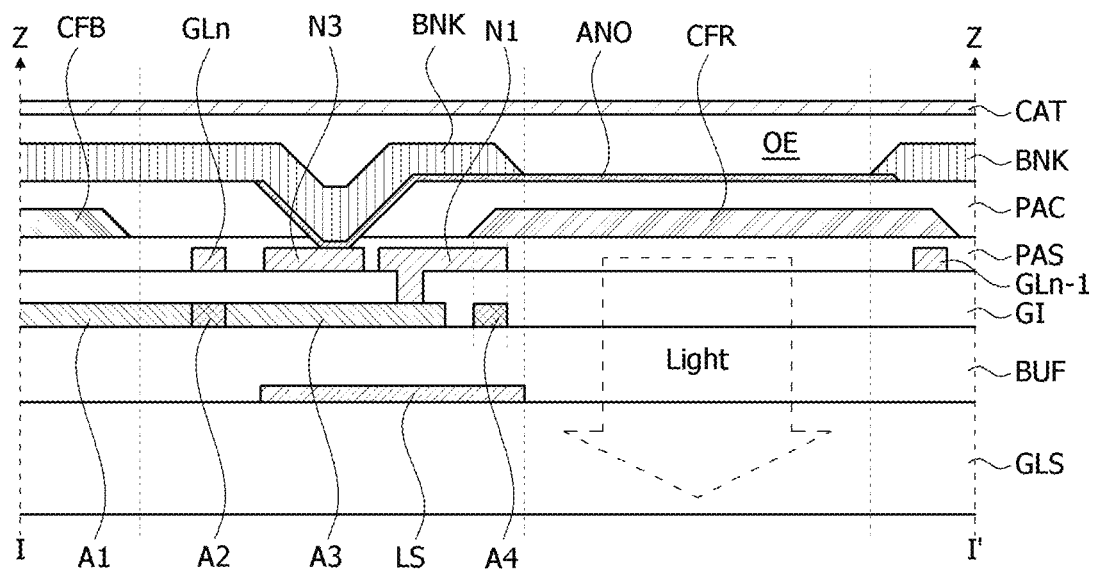
FIG. 5 is an example of a cross-sectional view of a display panel taken along line I-I' of FIG. 4.

Referring to FIGS. 4 and 5, in the display panel 100, a shielding layer LS formed of a first metal layer may be disposed on the transparent substrate GLS.

The shielding layer LS may overlap the driving element DT when viewed in the Z-axis direction. The shielding layer LS may block external light incident on a semiconductor layer A4 of the driving element DT through the transparent substrate GLS to prevent a phenomenon of generating a photocurrent from the driving element DT. A constant voltage outputted from the power supply 140 may be applied to the shielding layer LS. When a constant voltage is applied to the shielding layer LS, a residual charge that may be accumulated in the lower films of the driving element DT may be reduced, thereby reducing a change in the current-voltage characteristics of the driving element DT.

The shielding layer LS may overlap a semiconductor layer A1, A2, A3, and A4 of the driving element DT when viewed in the Z-axis direction. The shielding layer LS may be a single layer or multiple layers made of any one of molybdenum (Mo), aluminum (Al), chromium (Cr), nickel (Ni), neodymium (Nd), and copper (Cu), or an alloy thereof, but is not limited thereto.

A buffer layer BUF may be disposed on the shielding layer LS and the transparent substrate GLS so as to cover the shielding layer LS. The buffer layer BUF may block moisture and the like that may permeate from the outside. The buffer layer BUF may be formed of an insulating layer in which silicon oxide (SiOx), silicon nitride (SiNx), and the like are stacked.

The semiconductor layer A1, A2, A3, and A4 may be disposed on the buffer layer BUF. The semiconductor layer A1, A2, A3, and A4 may be formed of an oxide semiconductor, but is not limited thereto. Some portions A1 and A3 of the semiconductor layer A1, A2, A3, and A4 may become conductive or come into contact with a metal layer. The semiconductor layer A1, A2, A3, and A4 includes semiconductor channels of the driving element DT and the switch elements T1 and T2. In the case of an oxide semiconductor, e.g., indium gallium zinc oxide (IGZO), the conductivity characteristics vary depending on the oxygen content. As the oxygen content decreases, the conductivity of the oxide semiconductor increases, allowing it to become conductive. Plasma treatment may be used as a method to reduce the oxygen content of the oxide semiconductor. For example, exposing the oxide semiconductor to plasma (a conductive process) may remove the oxygen contained in the oxide semiconductor, thereby reducing the resistance of the oxide semiconductor and allowing it to be metalized.

A gate insulating layer GI may be disposed on the semiconductor layer A1, A2, A3, and A4 and the buffer layer BUF so as to cover the semiconductor layer A1, A2, A3, and A4. The gate insulating layer GI may be a double layer of silicon oxide (SiOx), silicon nitride (SiNx), or silicon oxide (SiOx) and silicon nitride (SiNx), but is not limited thereto.

A second metal layer may be disposed on the gate insulating layer GI. The second metal layer may include electrodes of the transistors constituting the pixel circuit, the gate lines GLn−1 and GLn, and the like. In FIG. 5, "N1" and "N3" represent the first and third nodes of the pixel circuit formed of the second metal layer. The second metal layer may be a single layer or multiple layers made of any one of molybdenum (Mo), aluminum (Al), chromium (Cr), gold (Au), titanium (Ti), nickel (Ni), neodymium (Nd), tungsten (W), and copper (Cu), or an alloy thereof, but is not limited thereto.

A passivation layer PAS may be disposed on the second metal layer and the gate insulating layer GI so as to cover the second metal layer. The passivation layer PAS may have a structure in which an inorganic insulating layer, an organic insulating layer, or an inorganic insulating layer and an organic insulating layer are stacked. Color filters CFB and CFR may be disposed on the passivation layer PAS.

A planarization layer PAC may be disposed on the color filters CFB and CFR and the passivation layer PAS so as to cover the color filters CFB and CFR. The planarization layer PAC may be an organic insulating layer, e.g., an acrylic resin, an epoxy resin, a phenolic resin, a polyamide resin, or a polyimide resin, but is not limited thereto.

An anode electrode ANO of the light-emitting element EL may be disposed on the planarization layer PAC. The anode electrode ANO may be a transparent or translucent electrode to which light passes. The anode electrode ANO may be connected to the third node N3 of the second metal layer through a contact hole penetrating the planarization layer PAC.

A bank layer BNK exposing the anode electrode ANO may be disposed on the planarization layer PAC. As shown in FIG. 4, the size and shape of the emission regions EW, ER, EG, and EB may vary in each of the sub-pixels by the bank layer BNK. The bank layer BNK may cover the edge portion of the anode electrode ANO. In order to optimize the color coordinates and white balance, as shown in FIG. 4, the size of the emission region may vary for each color of the sub-pixels. For example, the sizes of the first and second emission regions EW and ER may be larger than the size of each of the third and fourth emission regions EG and EB.

The bank layer BNK may be made of an organic insulating material having photosensitivity or a material containing black, but is not limited thereto. The bank layer BNK may be made at least one of an inorganic insulating material such as silicon nitride (SiNx) or silicon oxide (SiOx), or an organic insulating material such as benzocyclobutene (BCB), acrylic resin, epoxy resin, phenolic resin, polyamide resin, or polyimide resin, but is not limited thereto.

When the light-emitting element EL is implemented as an organic light emitting diode (OLED), an organic compound layer OE including an emission layer may be disposed on the bank layer BNK and the anode electrode ANO. A cathode electrode CAT of the light-emitting element EL may be disposed on the organic compound layer OE. The cathode electrode CAT may be implemented as a reflective electrode to increase the light efficiency.

An encapsulation layer may be disposed on the cathode electrode CAT. The encapsulation layer may protect the light-emitting element EL from oxygen and/or moisture from the outside. The encapsulation layer may be formed of at least two or more stacked insulating layers including an inorganic film and an organic film, but is not limited thereto. A touch sensor layer may be disposed on the encapsulation layer.

As can be seen in FIGS. 4 and 5, the data lines are disposed adjacent to each other, and the power lines are also disposed adjacent to each other, so that the emission region of each of the sub-pixels may increase. Accordingly, the aperture ratio of the sub-pixels may be improved.

Figure 6:
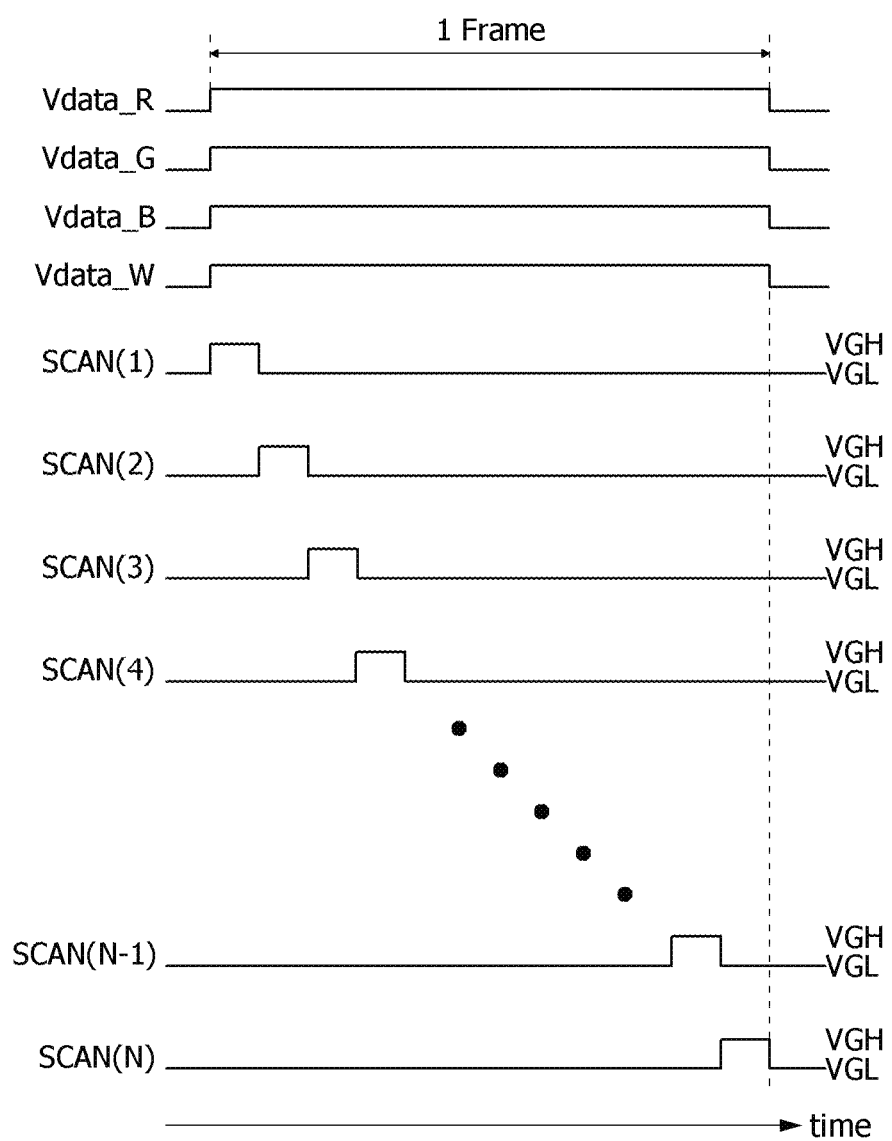
FIG. 6 is a waveform diagram illustrating an example of a data signal and a gate signal for driving a pixel circuit.

FIG. 6 is a waveform diagram illustrating an example of a data signal and a gate signal for driving a pixel circuit. In FIG. 6, "VGH" is the gate high voltage and "VGL" is the gate low voltage.

Referring to FIG. 6, gate pulses SCAN(1) to SCAN(N) are sequentially applied to the gate lines. A data voltage Vdata_W of the W data is applied to the pixel circuit CW of the first sub-pixel CW and EW through the first data line DLW1. A data voltage Vdata_R of the R data is applied to the pixel circuit CR of the second sub-pixel CR and ER through the second data line DLR1. A data voltage Vdata_G of the G data is applied to the pixel circuit CG of the third sub-pixel CG and EG through the third data line DLG1. A data voltage Vdata_B of the B data is applied to the pixel circuit CB of the fourth sub-pixel CB and EB through the fourth data line DLB1.

When a pure color or white image pattern is displayed on the display panel 100, there is no toggle in the data voltages Vdata_W, Vdata_R, Vdata_G, and Vdata_B applied to the data lines DLW, DLR, DLG, and DLB. Therefore, current consumption and heat generation hardly occur in the IC in which the data driver 112 is integrated.

According to one or more embodiments of the present disclosure, the display device may be applied to mobile devices, video phones, smart watches, watch phones, wearable device, foldable device, rollable device, bendable device, flexible device, curved device, sliding device, variable device, electronic organizer, electronic books, portable multimedia players (PMPs), personal digital assistants (PDAs), MP3 players, mobile medical devices, desktop PCs, laptop PCs, netbook computers, workstations, navigations, vehicle navigations, vehicle display devices, vehicle devices, theater devices, theater display devices, televisions, wallpaper devices, signage devices, game devices, laptops, monitors, cameras, camcorders, and home appliances, etc. Additionally, the display apparatus according to one or more example embodiments of the present disclosure may be applied to organic light emitting lighting devices or inorganic light emitting lighting devices.

In one or more examples, a pixel line may correspond to a row or a pixel row, and a pixel column may correspond to a column. In one or more examples, first and second pixel lines may denote $(n-1)^{th}$ and $n^{th}$ pixel lines, respectively, where n is a positive integer greater than or equal to 2. In one or more examples, first, second, third and fourth pixel columns may denote $(m-1)^{th}$, $m^{th}$, $(m+1)^{th}$ and $(m+2)^{th}$ pixel columns, respectively, where m is a positive integer greater than or equal to 2. The first, second, third, and fourth columns may be arranged sequentially, with each column directly adjacent to the next. A plurality of pixels include pixels. A plurality of sub-pixels include sub-pixels. An element may include one or more elements or may include multiple elements. A first power line may include multiple first power lines. A first power line may denote a REF line RL. A REF line RL may include multiple REF lines RL. A first power line may include third and fourth power lines. Third and fourth power lines may denote two REF lines RL.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The scope of protection of the present disclosure should be construed based on the following claims, and all technical features within the scope of equivalents thereof should be construed as being included within the scope of the present disclosure.

What is claimed is:

1. A display panel, comprising:
a plurality of pixels including a plurality of sub-pixels, wherein:
the plurality of sub-pixels are arranged in pixel lines and pixel columns;
the pixel columns include a first pixel column, a second pixel column, a third pixel column, and a fourth pixel column that are arranged sequentially;
the pixel lines extend along a first direction;
the pixel columns extend along a second direction orthogonal to the first direction;
each of the plurality of pixels includes a first sub-pixel, a second sub-pixel, a third sub-pixel, and a fourth sub-pixel adjacent to each other and configured to emit light having different colors;
the plurality of sub-pixels include the first sub-pixels, the second sub-pixels, the third sub-pixels, and the fourth sub-pixels; and
each sub-pixel of the plurality of sub-pixels includes a pixel circuit and an emission region connected to the pixel circuit, and
wherein:
when viewed in the second direction, the pixel circuit of each of sub-pixels arranged in the second pixel column and the third pixel column is disposed below the corresponding emission region, and the pixel circuit of each of sub-pixels arranged in the first pixel column and the fourth pixel column is disposed above the corresponding emission region; or
when viewed in the second direction, the pixel circuit of each of the sub-pixels arranged in the second pixel column and the third pixel column is disposed above the corresponding emission region, and the pixel circuit of each of the sub-pixels arranged in the first pixel column and the fourth pixel column is disposed below the corresponding emission region.

2. The display panel of claim 1, further comprising:
a plurality of gate lines disposed parallel to the first direction; and
a first data line pair, a second data line pair, and a third data line pair disposed parallel to the second direction,
wherein the first data line pair includes:
a first data line connected to the first sub-pixels that are in the first pixel column; and
a third data line arranged adjacent to the first data line and connected to the third sub-pixels that are in the first pixel column,
wherein the second data line pair includes:
a second data line connected to the second sub-pixels that are in the second pixel column and the third pixel column; and
a fourth data line arranged adjacent to the second data line and connected to the fourth sub-pixels that are in the second pixel column and the third pixel column,
wherein the third data line pair includes:
a fifth data line connected to the first sub-pixels that are in the fourth pixel column; and
a sixth data line arranged adjacent to the fifth data line and connected to the third sub-pixels that are in the fourth pixel column, and
wherein the second data line pair is spaced apart from each of the first data line pair and the third data line pair by a length of one pixel in the first direction, between the first data line pair and the third data line pair.

3. The display panel of claim 2, further comprising:
a first power line group parallel to the second direction and disposed between the first data line pair and the second data line pair; and
a second power line group parallel to the second direction and disposed between the second data line pair and the third data line pair,
wherein each of the first power line group and the second power line group includes:
a first power line to which a first constant voltage is for being supplied to the pixel circuit of each of the first sub-pixels that are adjacent to the first power line, the pixel circuit of each of the second sub-pixels that are adjacent to the first power line, the pixel circuit of each of the third sub-pixels that are adjacent to the first power line, and the pixel circuit of each of the fourth sub-pixels that are adjacent to the first power line; and
a second power line to which a second constant voltage is for being supplied to the pixel circuit of each of the first sub-pixels that are adjacent to the second power line, the pixel circuit of each of the second sub-pixels that are adjacent to the second power line, the pixel circuit of each of the third sub-pixels that are adjacent to the second power line, and the pixel circuit of each of the fourth sub-pixels that are adjacent to the second power line.

4. The display panel of claim 3, wherein each of the pixel circuits of the plurality of sub-pixels includes:
a driving transistor including a gate electrode connected to a first node, a first electrode connected to a second node, and a second electrode connected to a third node;
a light-emitting element including an anode electrode connected to the third node, and a cathode electrode to which a cathode voltage is for being applied;
a first switch transistor connected between a data line and the first node and configured to be turned on in response to a gate pulse being applied to a gate line;
a second switch transistor connected between the third node and the corresponding first power line and configured to be turned on in response to the gate pulse; and
a capacitor connected between the first node and the third node, and
wherein the corresponding second power line is connected to the second node.

5. The display panel of claim 3, wherein for each of the first and second power line groups:
the first power line includes third and fourth power lines;
each of the third and fourth power lines is disposed adjacently on a corresponding side of the second power line; and
a width of the second power line is greater than a width of each of the third and fourth power lines.

6. The display panel of claim 1,
wherein the pixel lines include a first pixel line and a second pixel line, and wherein the plurality of pixels comprises a first pixel including:
the first sub-pixel disposed at an intersection of the first pixel line and the first pixel column;
the second sub-pixel disposed at an intersection of the first pixel line and the second pixel column;
the third sub-pixel disposed at an intersection of the second pixel line and the first pixel column; and
the fourth sub-pixel disposed at an intersection of the second pixel line and the second pixel column.

7. The display panel of claim 6, wherein the plurality of pixels comprises a second pixel including:
the first sub-pixel disposed at an intersection of the second pixel line and the fourth pixel column;
the second sub-pixel disposed at an intersection of the second pixel line and the third pixel column;
the third sub-pixel disposed at an intersection of the first pixel line and the fourth pixel column; and
the fourth sub-pixel disposed at an intersection of the first pixel line and the third pixel column.

8. The display panel of claim 1, wherein for each of the plurality of pixels, the first sub-pixel is a white sub-pixel, the second sub-pixel is a red sub-pixel, the third sub-pixel is a green sub-pixel, and the fourth sub-pixel is a blue sub-pixel.

9. The display panel of claim 1, wherein for each of the plurality of pixels, the first sub-pixel, the second sub-pixel, the third sub-pixel, and the fourth sub-pixel are selected from a group consisting of a white sub-pixel, a red sub-pixel, a green sub-pixel and a blue sub-pixel.

10. The display panel of claim 9, wherein:
the plurality of pixels comprise a first pixel and a second pixel;
the first pixel and the second pixel are disposed in a left-right symmetrical structure with respect to the second direction; and
the plurality of pixels in a display area of the display panel are disposed in such a way that a structure of the first and second pixels is repeated.

11. A display device, comprising:
a display panel in which a plurality of data line pairs and a plurality of gate lines are arranged;
a data driving circuit configured to output data voltages to data lines of the plurality of data line pairs; and
a gate driving circuit configured to output gate pulses to the plurality of gate lines,
wherein the display panel further includes:
a plurality of pixels including a plurality of sub-pixels, wherein:
the plurality of sub-pixels are arranged in pixel lines and pixel columns;
the pixel columns include a first pixel column, a second pixel column, a third pixel column, and a fourth pixel column that are arranged sequentially;
the pixel lines extend along a first direction;
the pixel columns extend along a second direction orthogonal to the first direction;
each of the plurality of pixels includes a first sub-pixel, a second sub-pixel, a third sub-pixel, and a fourth sub-pixel adjacent to each other and configured to emit light having different colors;
the plurality of sub-pixels include the first sub-pixels, the second sub-pixels, the third sub-pixels, and the fourth sub-pixels; and
each sub-pixel of the plurality of sub-pixels includes a pixel circuit and an emission region connected to the pixel circuit, and
wherein:

when viewed in the second direction, the pixel circuit of each of sub-pixels arranged in the second pixel column and the third pixel column is disposed below the corresponding emission region, and the pixel circuit of each of sub-pixels arranged in the first pixel column and the fourth pixel column is disposed above the corresponding emission region; or
when viewed in the second direction, the pixel circuit of each of the sub-pixels arranged in the second pixel column and the third pixel column is disposed above the corresponding emission region, and the pixel circuit of each of the sub-pixels arranged in the first pixel column and the fourth pixel column is disposed below the corresponding emission region.

12. The display device of claim 11, wherein the plurality of data line pairs are disposed parallel to the second direction and include:
a first data line pair including a first data line connected to the first sub-pixels that are in the first pixel column and a third data line connected to the third sub-pixels that are in the first pixel column, wherein the first and third data lines are arranged adjacent to each other;
a second data line pair including a second data line connected to the second sub-pixels that are in the second pixel column and the third pixel column and a fourth data line connected to the fourth sub-pixels that are in the second pixel column and the third pixel column, wherein the second and fourth data lines are arranged adjacent to each other; and
a third data line pair including a fifth data line connected to the first sub-pixels that are in the fourth pixel column and a sixth data line connected to the third sub-pixels that are in the fourth pixel column, wherein the fifth and sixth data lines are arranged adjacent to each other, and
wherein the second data line pair is spaced apart from each of the first data line pair and the third data line pair by a length of one pixel in the first direction, between the first data line pair and the third data line pair.

13. The display device of claim 12, wherein a data voltage of a same color is for being applied to the corresponding data lines.

14. The display device of claim 13, wherein the display device is configured to display a pure color or a white color on the display panel without toggling any of the data lines.

15. The display device of claim 12, wherein the display panel further includes:
a first power line group parallel to the second direction and disposed between the first data line pair and the second data line pair; and
a second power line group parallel to the second direction and disposed between the second data line pair and the third data line pair, and
wherein each of the first power line group and the second power line group includes:
a first power line to which a first constant voltage is for being supplied to the pixel circuit of each of the first sub-pixels that are adjacent to the first power line, the pixel circuit of each of the second sub-pixels that are adjacent to the first power line, the pixel circuit of each of the third sub-pixels that are adjacent to the first power line, and the pixel circuit of each of the fourth sub-pixels that are adjacent to the first power line; and
a second power line to which a second constant voltage is for being supplied to the pixel circuit of each of the first sub-pixels that are adjacent to the second power line, the pixel circuit of each of the second sub-pixels that are adjacent to the second power line, the pixel circuit of each of the third sub-pixels that are adjacent to the second power line, and the pixel circuit of each of the fourth sub-pixels that are adjacent to the second power line.

16. The display device of claim 15, wherein each of the pixel circuits of the plurality of sub-pixels includes:
a driving transistor including a gate electrode connected to a first node, a first electrode connected to a second node, and a second electrode connected to a third node;
a light-emitting element including an anode electrode connected to the third node, and a cathode electrode to which a cathode voltage is for being applied;
a first switch transistor connected between a data line and the first node and configured to be turned on in response to a gate pulse being applied to a gate line;
a second switch transistor connected between the third node and the corresponding first power line and configured to be turned on in response to the gate pulse; and
a capacitor connected between the first node and the third node, and
wherein the corresponding second power line is connected to the second node.

17. The display device of claim 15, wherein for each of the first and second power line groups:
the first power line includes third and fourth power lines;
each of the third and fourth power lines is disposed adjacently on a corresponding side of the second power line; and
a width of the second power line is greater than a width of each of the third and fourth power lines.

18. The display device of claim 11,
wherein the pixel lines include a first pixel line and a second pixel line, and
wherein the plurality of pixels comprises a first pixel including:
the first sub-pixel disposed at an intersection of the first pixel line and the first pixel column;
the second sub-pixel disposed at an intersection of the first pixel line and the second pixel column;
the third sub-pixel disposed at an intersection of the second pixel line and the first pixel column; and
the fourth sub-pixel disposed at an intersection of the second pixel line and the second pixel column.

19. The display device of claim 18,
wherein the plurality of pixels comprises a second pixel including:
the first sub-pixel disposed at an intersection of the second pixel line and the fourth pixel column;
the second sub-pixel disposed at an intersection of the second pixel line and the third pixel column;
the third sub-pixel disposed at an intersection of the first pixel line and the fourth pixel column; and
the fourth sub-pixel disposed at an intersection of the first pixel line and the third pixel column.

20. The display device of claim 11, wherein for each of the plurality of pixels, the first sub-pixel, the second sub-pixel, the third sub-pixel, and the fourth sub-pixel are selected from a group consisting of a white sub-pixel, a red sub-pixel, a green sub-pixel and a blue sub-pixel.

21. The display device of claim 20, wherein:
the plurality of pixels comprise a first pixel and a second pixel;
the first pixel and the second pixel are disposed in a left-right symmetrical structure with respect to the second direction; and
the plurality of pixels in a display area of the display panel are disposed in such a way that a structure of the first and second pixels is repeated.

22. The display device of claim 11, wherein:
sub-pixels, among the plurality of sub-pixels, configured to emit light having a same color are disposed not consecutively along the first direction and not consecutively along the second direction.

23. The display device of claim 11, wherein:
for each of the plurality of pixels, the emission regions have sizes that are different from one another.

24. A display panel, comprising:
a plurality of pixels including a plurality of sub-pixels arranged along a first direction and a second direction orthogonal to the first direction; and
a first data line pair, a second data line pair, and a third data line pair disposed parallel to the second direction, wherein:
each of the plurality of pixels includes a first sub-pixel, a second sub-pixel, a third sub-pixel, and a fourth sub-pixel adjacent to each other and configured to emit light having different colors;
the plurality of sub-pixels include the first sub-pixels, the second sub-pixels, the third sub-pixels, and the fourth sub-pixels;
the first data line pair includes a first data line connected to the first sub-pixels that are adjacent to the first data line in the first direction and a third data line connected to the third sub-pixels that are adjacent to the third data line in the first direction, wherein the first and third data lines are arranged adjacent to each other;
the second data line pair includes a second data line connected to the second sub-pixels that are adjacent to the second data line in the first direction and a fourth data line connected to the fourth sub-pixels that are adjacent to the fourth data line in the first direction, wherein the second and fourth data lines are arranged adjacent to each other;
the third data line pair includes a fifth data line connected to the first sub-pixels that are adjacent to the fifth data line in the first direction and a sixth data line connected to the third sub-pixels that are adjacent to the sixth data line in the first direction, wherein the fifth and sixth data lines are arranged adjacent to each other; and
the second data line pair is spaced apart from each of the first data line pair and the third data line pair by a length of one pixel in the first direction, between the first data line pair and the third data line pair.

25. The display panel of claim 24, further comprising:
a first power line group parallel to the second direction and disposed between the first data line pair and the second data line pair; and
a second power line group parallel to the second direction and disposed between the second data line pair and the third data line pair,
wherein each sub-pixel of the plurality of sub-pixels includes a pixel circuit, and
wherein each of the first power line group and the second power line group includes:
a first power line to which a first constant voltage is for being supplied to the pixel circuit of each of the first sub-pixels that are adjacent to the first power line, the pixel circuit of each of the second sub-pixels that are adjacent to the first power line, the pixel circuit of each of the third sub-pixels that are adjacent to the first power line, and the pixel circuit of each of the fourth sub-pixels that are adjacent to the first power line; and a second power line to which a second constant voltage is for being supplied to the pixel circuit of each of the first sub-pixels that are adjacent to the second power line, the pixel circuit of each of the second sub-pixels that are adjacent to the second power line, the pixel circuit of each of the third sub-pixels that are adjacent to the second power line, and the pixel circuit of each of the fourth sub-pixels that are adjacent to the second power line.

26. The display panel of claim 25, further comprising:
a plurality of gate lines disposed parallel to the first direction,
wherein each of the pixel circuits of the plurality of sub-pixels includes:
a driving transistor including a gate electrode connected to a first node, a first electrode connected to a second node, and a second electrode connected to a third node;
a light-emitting element including an anode electrode connected to the third node, and a cathode electrode to which a cathode voltage is for being applied;
a first switch transistor connected between a data line and the first node and configured to be turned on in response to a gate pulse being applied to a gate line;
a second switch transistor connected between the third node and the corresponding first power line and configured to be turned on in response to the gate pulse; and
a capacitor connected between the first node and the third node, and
wherein the corresponding second power line is connected to the second node.

27. The display panel of claim 24, wherein for each of the plurality of pixels, the first sub-pixel, the second sub-pixel, the third sub-pixel and the fourth sub-pixel are selected from a group consisting of a white sub-pixel, a red sub-pixel, a green sub-pixel and a blue sub-pixel.

* * * * *